US012567721B2

(12) United States Patent　　　　(10) Patent No.:　US 12,567,721 B2
Lu　　　　　　　　　　　　　　　　　(45) Date of Patent:　　Mar. 3, 2026

(54) SINGLE-PHOTON SOURCE EMITTING SINGLE-PHOTON WITH CONTROLLABLE CIRCULAR POLARIZATION DIRECTION

(71) Applicant: Yuan Lu, Cambridge, MA (US)

(72) Inventor: Yuan Lu, Cambridge, MA (US)

( * ) Notice: Subject to any disclaimer, the term of this patent is extended or adjusted under 35 U.S.C. 154(b) by 573 days.

(21) Appl. No.: 18/100,757

(22) Filed: Jan. 24, 2023

(65) Prior Publication Data

US 2023/0163564 A1　　May 25, 2023

(30) Foreign Application Priority Data

Nov. 25, 2021　(CN) ........................ 202111439005.0

(51) Int. Cl.
　*H01S 5/06*　　　(2006.01)
　*H01S 5/042*　　(2006.01)
　*H01S 5/183*　　(2006.01)
(52) U.S. Cl.
　CPC .......... *H01S 5/0607* (2013.01); *H01S 5/0421* (2013.01); *H01S 5/183* (2013.01); *H01S 5/18355* (2013.01); *H01S 5/18361* (2013.01)
(58) Field of Classification Search
　CPC ...... H01S 5/0607; H01S 5/0421; H01S 5/183; H01S 5/18355
　See application file for complete search history.

(56) References Cited

U.S. PATENT DOCUMENTS

2002/0196827 A1 * 12/2002 Shields ..................... H01S 5/10
　　　　　　　　　　　　　　　　　　　　257/14
2011/0272671 A1 * 11/2011 Skiba-Szymanska ......................
　　　　　　　　　　　　　　　　　　　H10D 62/813
　　　　　　　　　　　　　　　　　　　　257/14
2023/0297340 A1 * 9/2023 Frougier ................. G06F 7/588
　　　　　　　　　　　　　　　　　　　　708/255

FOREIGN PATENT DOCUMENTS

CN　　　103779463 A　*　5/2014　........... H10H 20/812

OTHER PUBLICATIONS

Machine translation of CN 103779463A (Year: 2014).*
B. Lounis and M. Orrit, Single-photon sources, Rep. Prog. Phys. 68, 1129 (2005).
S. Buckley, K. Rivoire, and J. Vu kovi , Engineered quantum dot single-photon sources, Rep. Prog. Phys. 75, 126503 (2012).
P. Kok, W. J. Munro, K. Nemoto, T. C. Ralph, J. P. Dowling, and G. J. Milburn, Linear optical quantum computing with photonic qubits, Rev. Mod. Phys. 79, 135 (2007).
(Continued)

*Primary Examiner* — Yuanda Zhang
(74) *Attorney, Agent, or Firm* — IPro, PLLC

(57)　　　　　　　　ABSTRACT

Disclosed is a single-photon source emitting light with controllable circular polarization direction. A pillar structure above a semiconductor substrate includes a semiconductor single-quantum-dot structure. A spin injection layer is arranged above the pillar structure. A pulsed voltage is applied between the spin injection layer and the semiconductor substrate to inject a spin-polarized single-carrier from the spin injection layer into the semiconductor single-quantum-dot structure. In response to the injected single-carrier, a single-quantum-dot emits a single-photon with a circular polarization direction corresponding to the spin direction of the injected single-carrier. The polarization controllable single-photon source allows to use magnetic or electrical means to modulate the circular polarization direction of single-photon. The modulation speed by electrical mean can reach up to GHz range.

14 Claims, 11 Drawing Sheets

(56)     References Cited

OTHER PUBLICATIONS

J. L. O Brien, A. Furusawa, and J. Vu kovi , Photonic quantum technologies, Nat. Photonics 3, 687 (2009).

J.-W. Pan, Z.-B. Chen, C.-Y. Lu, H. Weinfurter, A. Zeilinger, and M. ukowski, Multiphoton entanglement and interferometry, Rev. Mod. Phys. 84, 777 (2012).

S. Aaronson and A. Arkhipov, Proceedings of the 43rd Annual ACM Symposium on Theory of Computing, 2011, San Jose (ACM, New York, 2011), p. 333.

H.-S. Zhong, H. Wang, Y-H. Deng, M.-C. Chen, L. C. Peng, Y.-H. Luo, J. Qin, D. Wu, X. Ding, Y. Hu, P. Hu, X.-Y. Yang, W.-J. Zhang, H. Li, Y. Li, X. Jiang, L. Gan, G. Yang, L. You, Z. Wang, L. Li, N.-L. Liu, C.-Y. Lu, and J.-W. Pan, Quantum computational advantage using photons, Science 370, 1460 (2020).

Xing Ding, Yu He, Z.-C. Duan, Niels Gregersen, M.-C. Chen, S. Unsleber, S. Maier, Christian Schneider, Martin Kamp, Sven H fling, Chao-Yang Lu, and Jian-Wei Pan, On-Demand Single-photons with High Extraction Efficiency and Near-Unity Indistinguishability from a Resonantly Driven Quantum Dot in a Micropillar, Phys. Rev. Lett. 116, 020401 (2016).

Ravitej Uppu, Freja T. Pedersen, Ying Wang, Cecilie T. Olesen, Camille Papon, Xiaoyan Zhou, Leonardo Midolo, Sven Scholz, Andreas D. Wieck, Arne Ludwig, Peter Lodahl, Scalable integrated single-photon source, Sci. Adv. 6: eabc8268 (2020).

Dyakonov, M. I.; Perel, V. L., Optical orientation / F. Meier, B.P. Zakharchenya. Amsterdam 1984, 8, 22-24.

R. Fiederling, M. Keim, G. Reuscher, W. Ossau, G. Schmidt, A. Waag, L. W. Molenkamp, Injection and detection of a spin-polarized current in a light-emitting diode, Nature 402, 787 (1999).

Liu, C.-F. Pai, Y. Li, H. W. Tseng, D. C. Ralph, R. A. Buhrman, Spin-torque switching with the giant spin Hall effect of tantalum, Science 336, 555 (2012).

Hongwei Li, Gaili Wang, Dan Li, Ping Hu, Wenqi Zhou, Shuai Dang, Xingyuan Ma, Tian Dai, Songdan Kang, Fengmei Yu, Xiang Zhou, Shuxiang Wu, and Shuwei Li, Field-Free Deterministic Magnetization Switching with Ultralow Current Density in Epitaxial Au/Fe4N Bilayer Films, ACS Appl. Mater. Interfaces 11, 16965 (2019).

Liang Liu, Jihang Yu, Rafael Gonz lez-Hern ndez, Changjian Li, Jinyu Deng, Weinan Lin, Chenghang Zhou, Tiejun Zhou, Jing Zhou, Han Wang, Rui Guo, Herng Yau Yoong, Gan Moog Chow, Xiufeng Han, Bertrand Dup , Jakub elezn , Jairo Sinova, and Jingsheng Chen, Electrical switching of perpendicular magnetization in a single ferromagnetic layer, Phys. Rev. B 101, 220402(R) (2020).

Liang Liu, Chenghang Zhou, Xinyu Shu, Changjian Li, Tieyang Zhao, Weinan Lin, Jinyu Deng, Qidong Xie, Shaohai Chen, Jing Zhou, Rui Guo, Han Wang, Jihang Yu, Shu Shi, Ping Yang, Stephen Pennycook, Aurelien Manchon, and Jingsheng Chen, Symmetry-dependent field-free switching of perpendicular magnetization, Nature Nanotechnology, 16, 277 (2021).

K. Garello et al., "SOT-MRAM 300MM Integration for Low Power and Ultrafast Embedded Memories," 2018 IEEE Symposium on VLSI Circuits, 2018, pp. 81-82, doi: 10.1109/VLSIC.2018. 8502269.

Yuqing Huang, Ville Poloj rvi, Satoshi Hiura, Pontus H jer, Arto Aho, Riku Isoaho, Teemu Hakkarainen, Mircea Guina, Shino Sato, Junichi Takayama, Akihiro Murayama, Irina A. Buyanova 1 and Weimin M. Chen, Room-temperature electron spin polarization exceeding 90% in an opto-spintronic semiconductor nanostructure via remote spin filtering, Nature Photonics 15, 475 (2021).

* cited by examiner $P(N)=1/2^N$ $P(N)=1$

SINGLE-PHOTON SOURCE EMITTING SINGLE-PHOTON WITH CONTROLLABLE CIRCULAR POLARIZATION DIRECTION

CROSS-REFERENCE TO RELATED APPLICATION

This application claims priority to Chinese patent application No. 202111439005.0 filed on Nov. 25, 2021, the disclosure of which is incorporated herein by reference in its entirety and for all purposes.

TECHNICAL FIELD

The present disclosure herein relates quantum dot technology, in particular, relates to a single-photon source with controllable circular polarization based on quantum dot.

BACKGROUND

In order to realize quantum optical communication, quantum optical computation and so on, a single-photon source device that meets related requirements is necessary.

A single-photon source device can deterministically emit one and only one single-photon at a time [Refs. 1, 2], and is of the core technology in developing miniaturized optical quantum devices [Refs. 3, 4, 5].

It is particularly important that single-photon source devices are very meaningful for Boson sampling in quantum computing process [Ref. 6]. If 20 to 30 single-photons can be utilized in Boson sampling calculation, some very difficult and complex tasks for a classical computer can be completed [Ref. 7].

In order to make the single-photon source device practical, the single-photon source must meet the following criteria at the same time:

(1) high emission efficiency of single-photons;
(2) the emitted multiple single-photons have anti-bunching property;
(3) the emitted multiple single-photons are indistinguishable.

To this day, among all solid-state single-photon source devices, self-assembling quantum dot devices have been proved to have the highest quantum emission efficiency [Ref. 8, 9]. Therefore, it is very promising to achieve a practical single-photon source with self-assembling quantum dot devices. However, in general, a single-quantum-dot currently pumped electrically or optically can only emit single-photons with random polarization directions.

In order to obtain a single-photon with a determined polarization direction, or further, in order to meet the requirement that multiple single-photons emitted by multiple single-photon sources have an identical polarization direction and thus meets the requirement of being indistinguishable, a polarizer must be used to filter single-photons with different polarization directions. Therefore, there is a half possibility that the emitted photons will be blocked by the polarizer. This inherent difficulty greatly reduces the emission efficiency of single-photons.

Thus, it is still necessary to provide a single-photon source device capable of emitting single-photons with a determined polarization direction with a high efficiency, so as to be used in quantum optical communication or quantum optical computation applications.

SUMMARY

One of the technical problems to be solved by the present disclosure is to provide a single-photon source device capable of emitting single-photons with a determined polarization direction with a high efficiency.

According to the first aspect of the present disclosure, a single-photon source emitting light with a controllable circular polarization direction is provided, comprising: a semiconductor substrate; a pillar structure located above the semiconductor substrate and comprising a semiconductor single-quantum-dot structure; a spin injection layer located above the pillar structure and configured to inject a spin-polarized carrier into the semiconductor single-quantum-dot structure; a first electrode and a second electrode respectively connected to the spin injection layer and the semiconductor substrate and configured to apply a pulsed voltage between the spin injection layer and the semiconductor substrate, so as to inject a spin-polarized single-carrier into the semiconductor single-quantum-dot structure from the spin injection layer, wherein in response to the injected spin-polarized single-carrier, a single-photon is emitted from the single-quantum-dot in the semiconductor single-quantum-dot structure with the circular polarization direction determined by the spin direction of the spin-polarized single-carrier.

Optionally, the single-photon source may further comprise a magnetic moment controller configured to polarize a magnetization direction of the spin injection layer, after the magnetization direction of the spin injection layer is polarized, the pulsed voltage is applied between the spin injection layer and the semiconductor substrate via the first electrode and the second electrode, the spin-polarized single-carrier will be injected into the semiconductor single-quantum-dot structure from the spin injection layer, the spin direction of the spin-polarized single-carrier depends on the polarized magnetization direction of the spin injection layer.

Optionally, the magnetic moment controller may comprise an external magnetic field application device for applying pulsed magnetic field to the spin injection layer to polarize the magnetization direction of the spin injection layer.

Optionally, the external magnetic field application device is controlled to apply alternating reverse pulsed magnetic field to the spin injection layer, so as to alternatively switch the magnetization direction of the spin injection layer.

Optionally, the pulsed voltage is applied in the interval between adjacent applications of pulsed magnetic field.

Optionally, the spin injection layer has a Hall bar channel, the magnetic moment controller comprises a third electrode and a fourth electrode respectively connected to two opposite ends of the Hall bar channel to apply a pulsed current into the Hall bar channel, so as to polarize the magnetization direction of the spin injection layer.

Optionally, alternating reverse pulsed current is applied into the Hall bar channel to alternatively reverse the magnetization direction of the spin injection layer.

Optionally, the pulsed voltage is applied in the interval between adjacent applications of pulsed current.

Optionally, the first electrode can be suppressed. The third or fourth electrode can connect to the spin injection layer and the second electrode can connect to the semiconductor substrate in order to apply a pulsed voltage between the spin injection layer and the semiconductor substrate to emit single-photon.

Optionally, the single-photon source may further comprise a spin filtering layer located between the spin injection layer and the semiconductor single-quantum-dot structure and playing a role to filter spin by spin selective recombination of the spin-polarized carrier passing through.

Optionally, the spin filtering layer may locate below semiconductor single-quantum-dot structure and playing a role of filter spin by reflecting spin polarized carrier into single-quantum-dot due to the spin selective recombination effect.

Optionally, the pillar structure may further comprise a bottom distributed Bragg reflector located below the semiconductor single-quantum-dot structure to enhance output efficiency of single-photon in an upward direction.

Optionally, the single-photon source may further comprise a top distributed Bragg reflector above the spin injection layer, an intracavity resonant surface emitting laser structure is formed between the top distributed Bragg reflector and the bottom distributed Bragg reflector.

Optionally, the single-photon source may further comprise an external mirror above the spin injection layer, an external resonant surface emitting laser structure is formed between the external mirror and the bottom distributed Bragg reflector.

Optionally, the spin injection layer may comprise an aperture directly above the single-quantum-dot in the semiconductor single-quantum-dot structure.

According to the second aspect of the present disclosure, a single-photon source cluster is provided, comprising: a plurality of single-photon sources according the first aspect of the present disclosure, the plurality of single-photon sources share the same semiconductor substrate, wherein the magnetization directions of the spin injection layers of the plurality of single-photon sources are polarized to the same direction, a single pulsed voltage is simultaneously applied between the semiconductor substrate and the spin injection layer of each single-photon source, spin-polarized single-carriers are respectively injected into each of the semiconductor single-quantum-dot structures from the spin injection layers simultaneously, and single-photons with identical circular polarization direction are respectively emitted by the single-quantum-dots in the semiconductor single-quantum-dot structures of the plurality of single-photon sources simultaneously.

Thus, the single-photon source of the present disclosure can emit single-photons with a determined polarization direction with a high efficiency. The circular polarization of single-photon can be modulated by magnetic field or electrical means. And a single-photon source cluster including multiple single-photon sources can synchronously emit multiple indistinguishable single-photons with a high efficiency.

BRIEF DESCRIPTION OF FIGURES

By more detailed description of the exemplary embodiments of the present disclosure in combination with the accompanying drawings, the above and other purposes, features and advantages of the present disclosure will become more apparent. In the exemplary embodiments of the present disclosure, the same reference numeral generally represents the same component.

4

Figure 5:
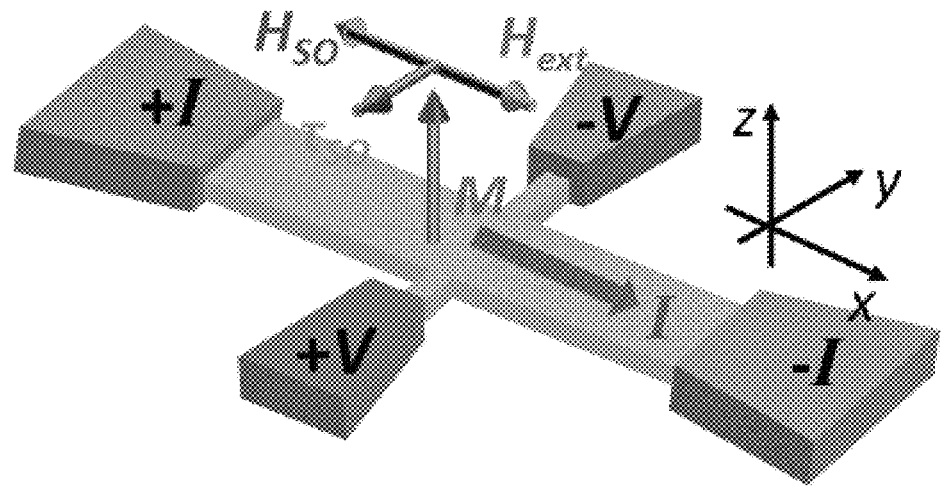

FIG. 5 is a schematic diagram of magnetic moment reversal by means of spin Hall effect in the Hall bar channel of spin injection layer.

Figure 6:
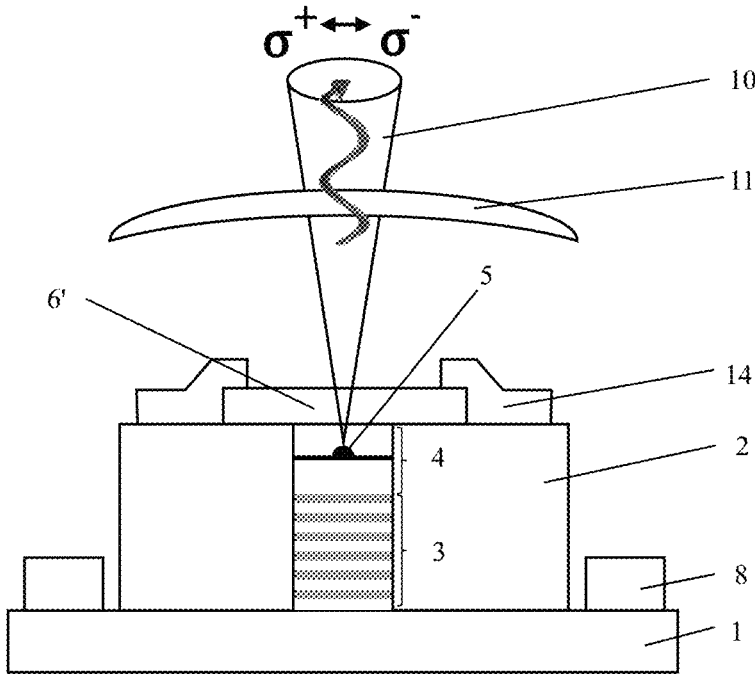

FIG. 6 is a schematic side sectional view of a single-photon source structure according to Embodiment II of the present disclosure.

Figure 7:
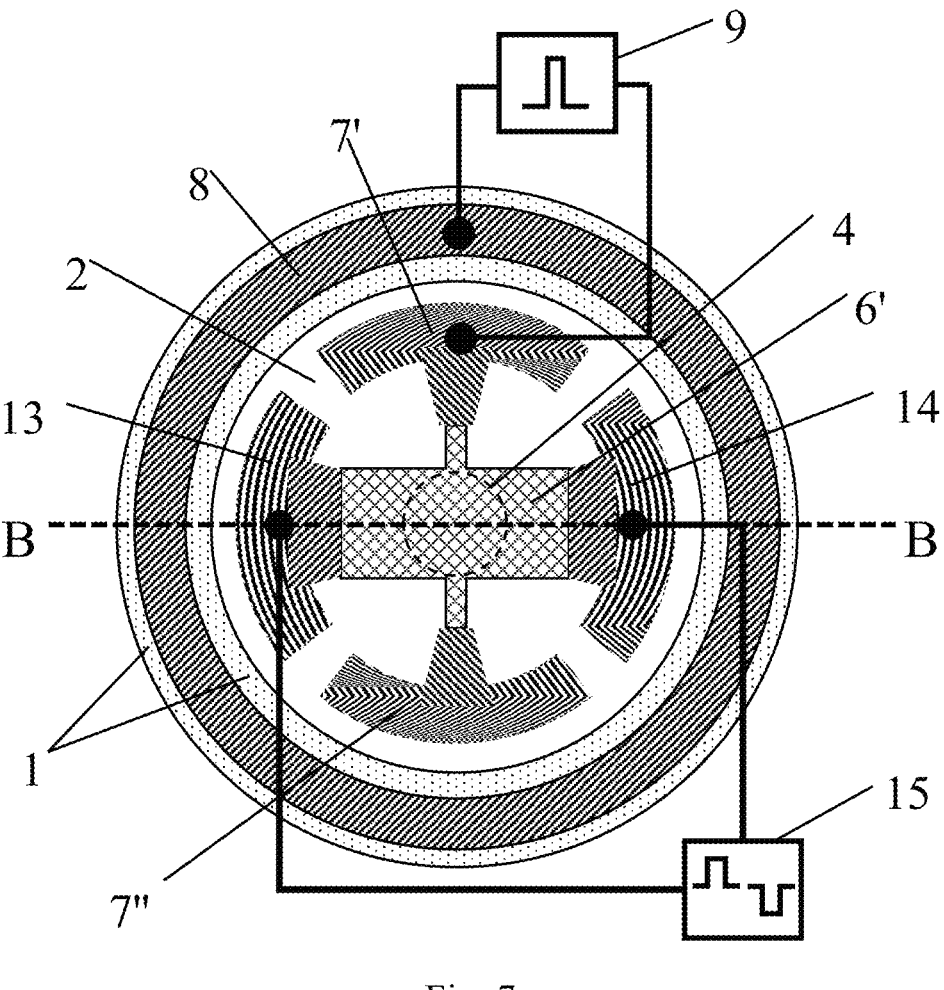

FIG. 7 is a schematic top view of a single-photon source structure according to Embodiment II of the present disclosure.

Figure 8:
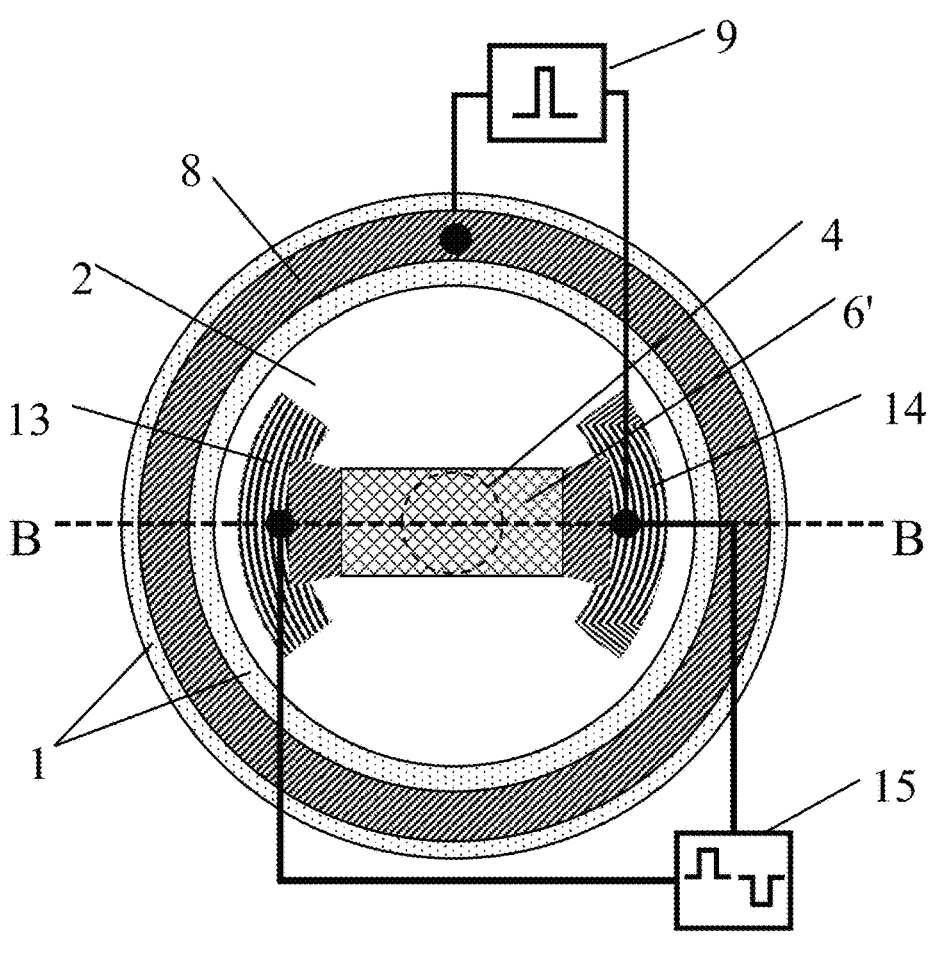

FIG. 8 is a schematic top view of a single-photon source structure with only two electrodes connected to the spin injection layer according to Embodiment II of the present disclosure.

Figure 9:
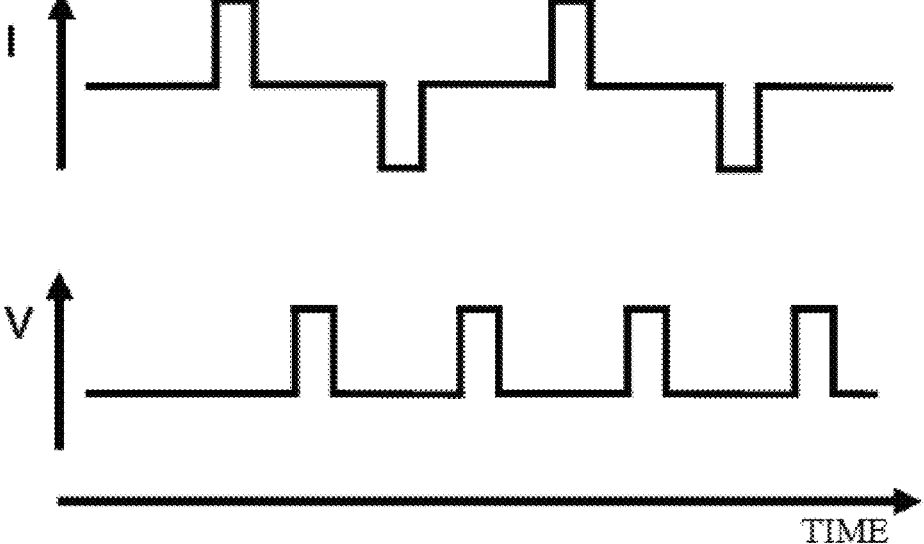

FIG. 9 is a working time sequence diagram of a single-photon source according to Embodiment II of the present disclosure.

Figure 10A:
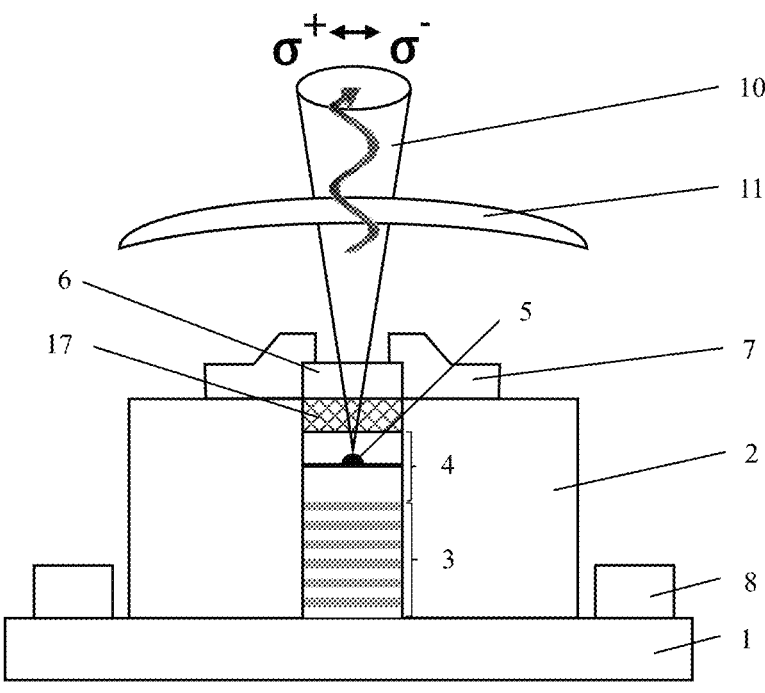

FIG. 10A is a schematic diagram of incorporating a spin filtering layer to the single-photon source structure in Embodiment I of the present disclosure.

Figure 10B:
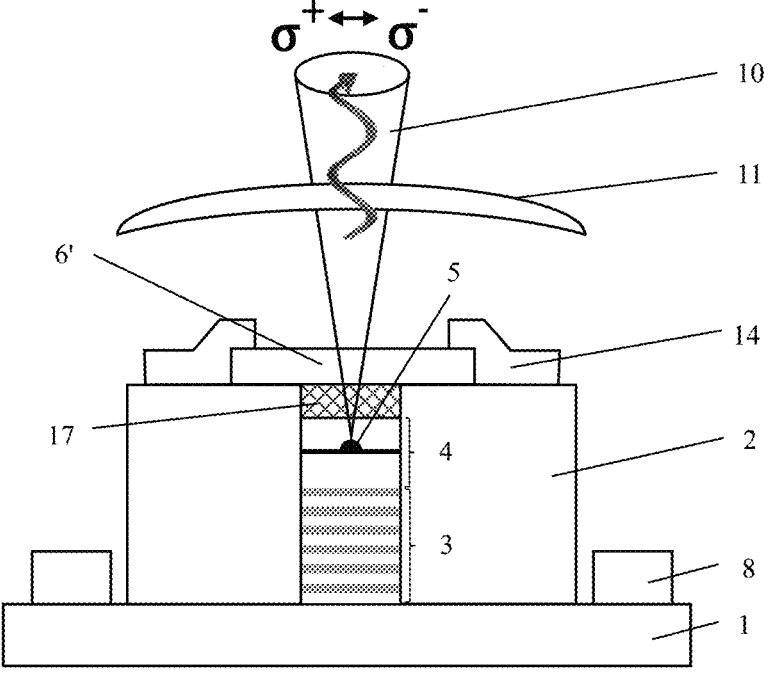

FIG. 10B is a schematic diagram of incorporating a spin filtering layer to the single-photon source structure in Embodiment II of the present disclosure.

Figure 11A:
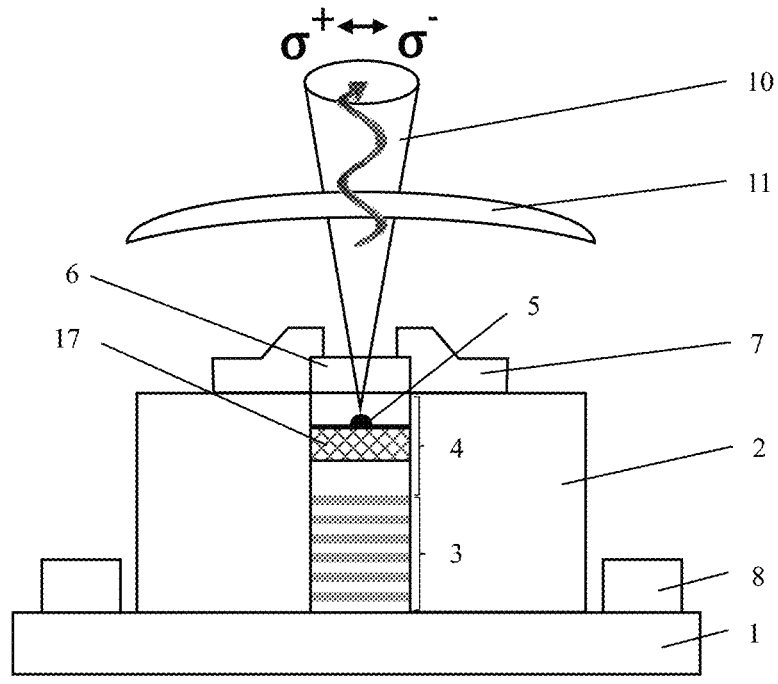

FIG. 11A is a schematic diagram of incorporating a spin filtering layer under the semiconductor single-quantum-dot structure to the single-photon source structure in Embodiment I of the present disclosure.

Figure 11B:
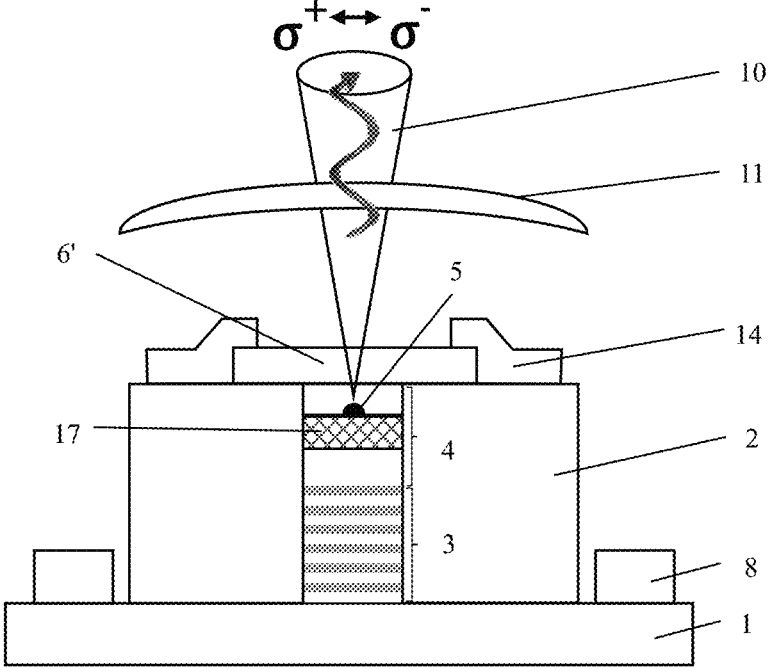

FIG. 11B is a schematic diagram of incorporating a spin filtering layer under the semiconductor single-quantum-dot structure to the single-photon source structure in Embodiment II of the present disclosure.

Figure 12A:
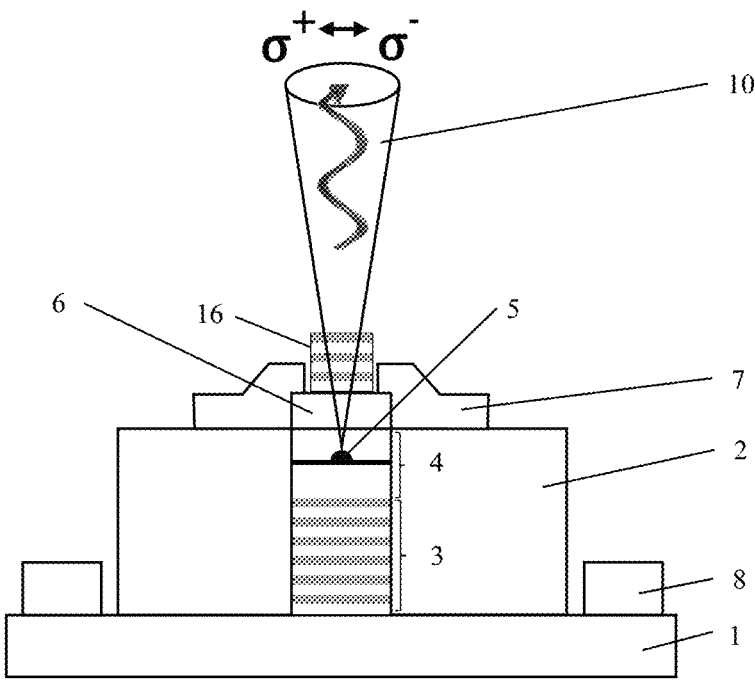

FIG. 12A is a schematic diagram showing that an intracavity resonant surface emitting laser is formed by incorporating a top DBR to the single-photon source structure in Embodiment I of the present disclosure.

Figure 12B:
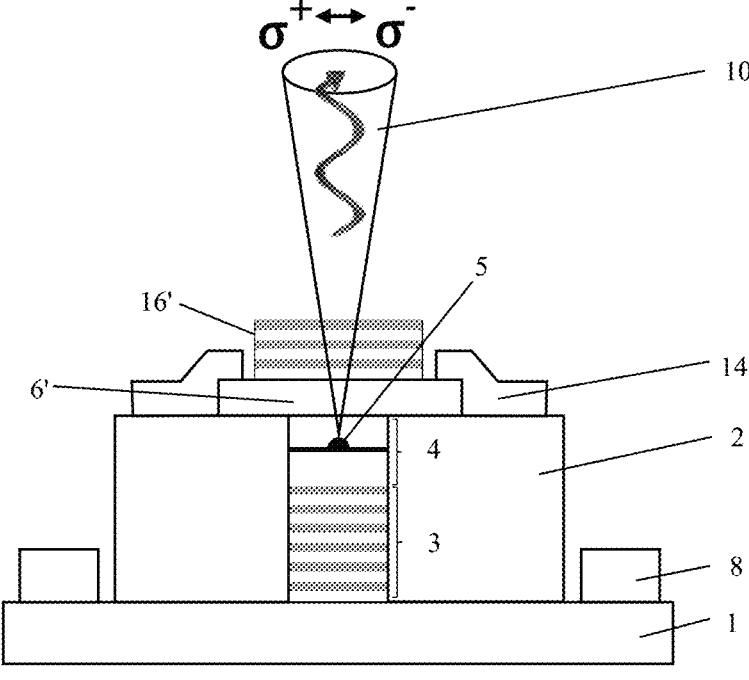

FIG. 12B is a schematic diagram showing that an intracavity resonant surface emitting laser is formed by incorporating a top DBR to the single-photon source structure in Embodiment II of the present disclosure.

Figures 13A, 13B:
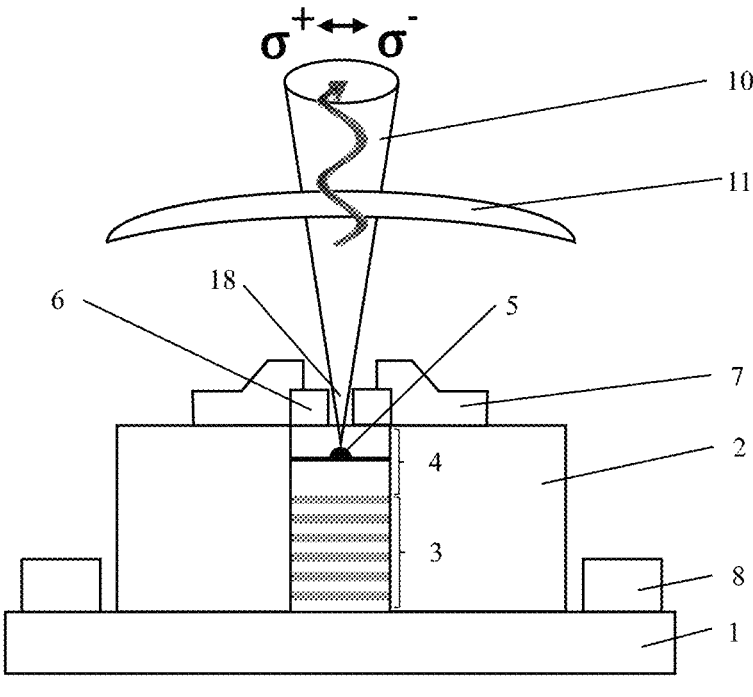

FIG. 13A is a schematic diagram of arranging an optical aperture in the single-photon source structure of Embodiment I of the present disclosure to improve the emission efficiency of single-photons.

FIG. 13B is a schematic diagram of arranging an optical aperture in the single-photon source structure of Embodiment II of the present disclosure to improve the emission efficiency of single-photons.

Figure 14:
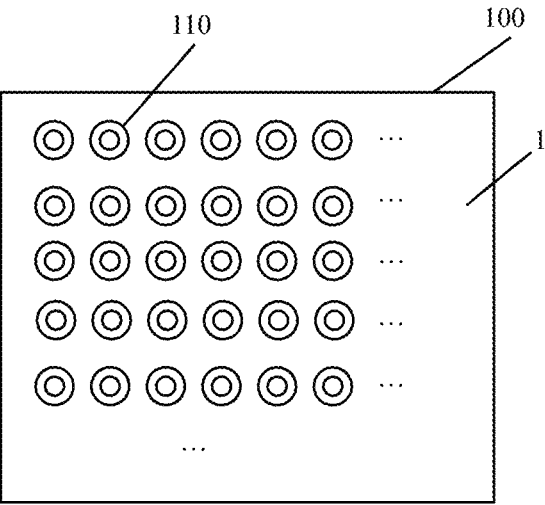

FIG. 14 is a schematic top view of a single-photon source cluster according to the present disclosure.

Figure 15A:
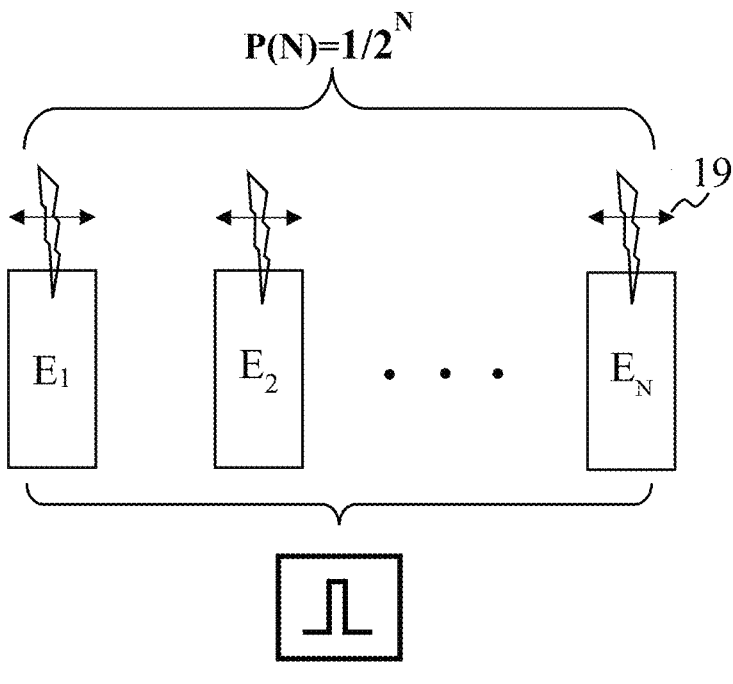

FIG. 15A is a schematic diagram of the probability of an ordinary single-photon source simultaneously collecting N single-photons having the same polarization direction.

Figure 15B:
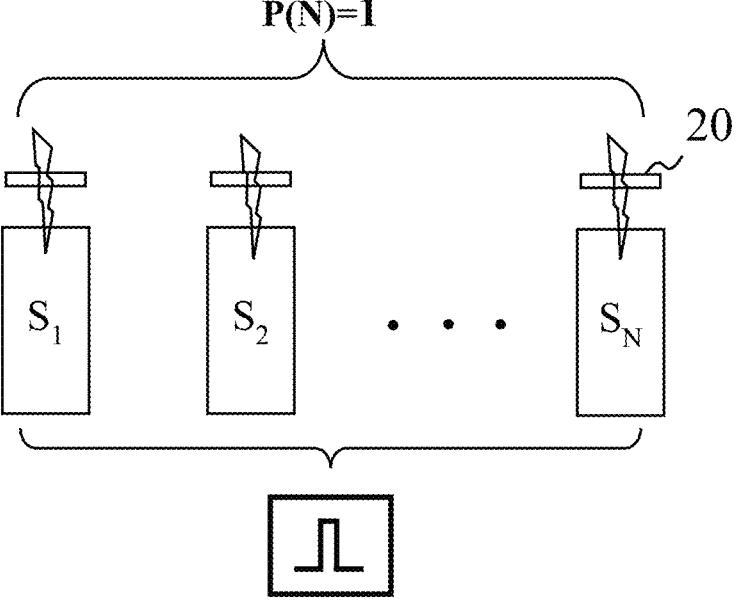

FIG. 15B is a schematic diagram of the probability of the single-photon source according to the present disclosure simultaneously collecting N single-photons having the same polarization direction.

Description of reference numerals: 1: substrate; 2: insulating material layer; 3: bottom DBR; 4: semiconductor pillar structure; 5: quantum dot; 6, 6': spin injection layer; 7, 7', 7": first electrode; 8: second electrode; 9: pulsed voltage source; 10: single-photon beam; 11: external mirror; 12, 12': external magnetic field application device; 13: third electrode; 14: fourth electrode; 15: pulse current source; 16, 16': top DBR; 17: spin filtering layer; 18, 18': aperture; 19: polarizer; 20: ¼ wave plate; 100: single-photon source cluster; 110: single-photon source.

DETAILED DESCRIPTION

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

In order to solve the fore-mentioned technical problems, the present disclosure provides technical solution in which a single-photon with a determined polarization direction is emitted directly from a single-quantum-dot.

Semiconductor spintronics technology will be very helpful to achieve this objective. By depositing a ferromagnetic layer as a spin injection layer on the top of the quantum dot structure (for example, a PN junction with a structure similar to that of a light emitting diode (LED)), a spin-polarized electron can be injected into such a light emitting diode. The spin-polarized electron will undergo quantum transition according to the law of conservation of angular momentum, recombine with holes, and thus circularly polarized light will be emitted.

Figure 1:
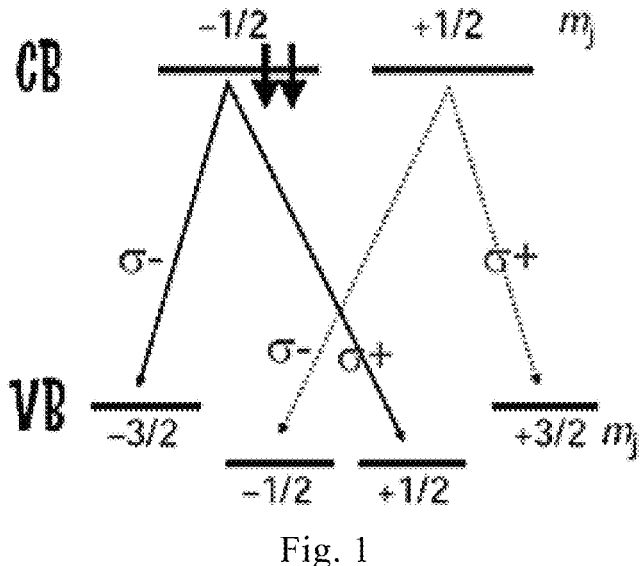
FIG. 1 shows the selection rule of optical transition in direct band gap semiconductor quantum dots.

FIG. 1 shows the selection rule of optical transition in direct band gap semiconductor quantum dots [Ref. 10].

As shown in FIG. 1, when an electron with spin of $-\frac{1}{2}$ is injected into the conduction band of a semiconductor single-quantum-dot through a ferromagnetic spin injection layer (such as CoFeB/MgO layer), according to the conservation law of angular momentum quantum number m (the change of angular momentum quantum number before and after the transition $\Delta m_j=\pm 1$), the electron is allowed to transition to the valence band only in two ways.

One way is to transition with a heavy hole valence band ($m_j=-3/2$), that is, to transition from $m_j=-\frac{1}{2}$ to $m_j=-3/2$ ($\Delta m=-1$), emitting a left circularly polarized single-photon, which can be referred to as "σ−".

The other way is to transition with a light hole valence band ($m_j=+\frac{1}{2}$), that is, to transition from $m_j=-\frac{1}{2}$ to $m_j=+\frac{1}{2}$ ($\Delta m_j=+1$), emitting a right circularly polarized single-photon, which can be referred to as "σ+".

However, in the quantum dot structure, the light and heavy hole valence bands are non-degenerated, and the heavy hole transition matrix element (transition probability) is much higher than the light hole transition matrix element (transition probability). Therefore, while an electron with spin of $-\frac{1}{2}$ is injected, a left circularly polarized single-photon (σ−) will be obtained with almost 100% probability.

Conversely, while an electron with spin of $+\frac{1}{2}$ is injected, a right circularly polarized single-photon (σ+) will be obtained with almost 100% probability.

Therefore, the degree of circular polarization of the single-photon emitted from a quantum dot completely depends on the spin direction of the injected electron [Ref. 11]. It should be emphasized here that the optical selection rule requires the spin direction to be parallel to the photon emission direction. To obtain a circularly polarized single-photon without magnetic field, the magnetization direction of the ferromagnetic injection layer must be perpendicular to the sample surface for surface emission geometry.

Based on the above principle, the present disclosure proposes a novel single-photon source device. In the single-photon source device, a pillar structure is formed above a semiconductor substrate. The pillar structure includes a semiconductor single-quantum-dot structure. A spin injection layer is arranged above the pillar structure to inject spin-polarized carrier into the semiconductor single-quantum-dot structure. Here, the carrier can be an electron or a hole. Generally, the carrier can be an electron because the spin lifetime of an electron is much longer than that of a hole.

A first electrode and a second electrode are connected to the spin injection layer and the semiconductor substrate respectively, and are used to apply a pulsed voltage between the spin injection layer and the semiconductor substrate to inject a spin-polarized single-carrier from the spin injection layer into the semiconductor single-quantum-dot structure.

In response to the injected single-carrier in the single-quantum-dot, a single-photon is emitted from the single-quantum-dot structure. As mentioned above, the circular polarization direction of the single-photon is determined by (corresponds to) the spin direction of the single-carrier.

In addition, a magnetic moment controller can be further provided for polarizing (or reversing) the magnetization direction of the spin injection layer.

After the magnetization direction of the spin injection layer is polarized, a pulsed voltage is applied between the spin injection layer and the semiconductor substrate through the first and second electrodes to inject a spin-polarized single-carrier from the spin injection layer into the semiconductor single-quantum-dot structure. In this way, the spin direction of a single-carrier depends on the polarized magnetization direction of the spin injection layer. Accordingly, the circular polarization direction of the emitted single-photon can also be controlled by the polarization of the magnetization direction.

Hereinafter, the single-photon source according to the present disclosure will be further described with reference to FIGS. 2 to 13B associated with two embodiments. In Embodiment I and Embodiment II, the magnetization direction of the spin injection layer is polarized (or reversed) in different ways. Accordingly, the spin injection layers of the two embodiments may have different shapes.

Embodiment I

In Embodiment I, the spin injection layer in a shape of a disk can be used, that is, in the top view, the spin injection layer is in the shape of a disk. It should be understood that the spin injection layer and the pillar structure above the semiconductor substrate can be in other shapes, such as elliptical shapes.

In Embodiment I, for example, the magnetization of spin injection layer can be controlled by applying an external magnetic field, which is perpendicular to the sample surface. For example, an external pulsed magnetic field can be applied to polarize (or reverse) the magnetization direction, and then a vertical pulsed voltage can be applied between the spin injection layer and the substrate to emit circularly polarized single-photons.

Figure 2:
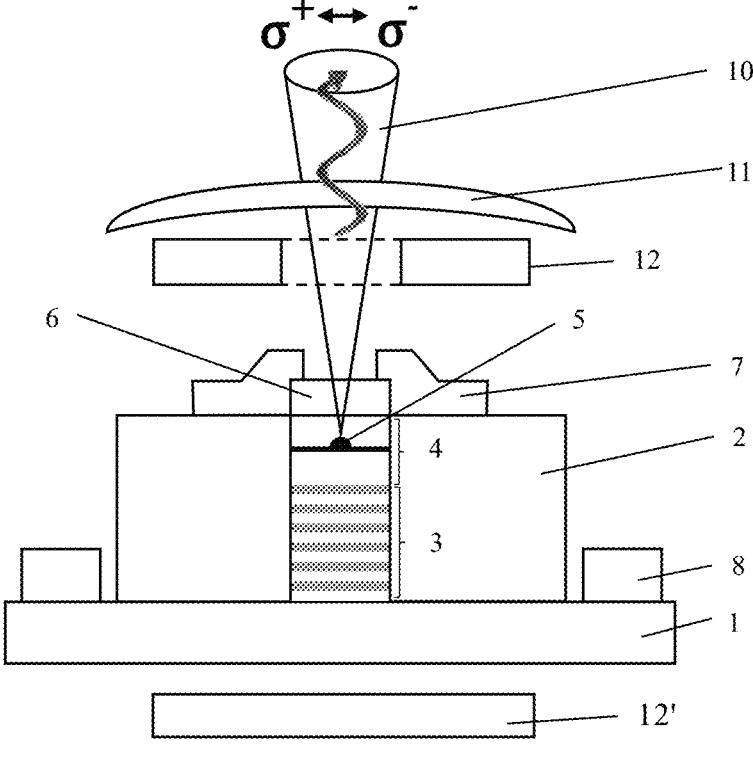
FIG. 2 is a schematic side sectional view of a single-photon source structure according to Embodiment I of the present disclosure.

FIG. 2 is a schematic side sectional view of a single-photon source structure according to Embodiment I of the present disclosure.

Figure 3:
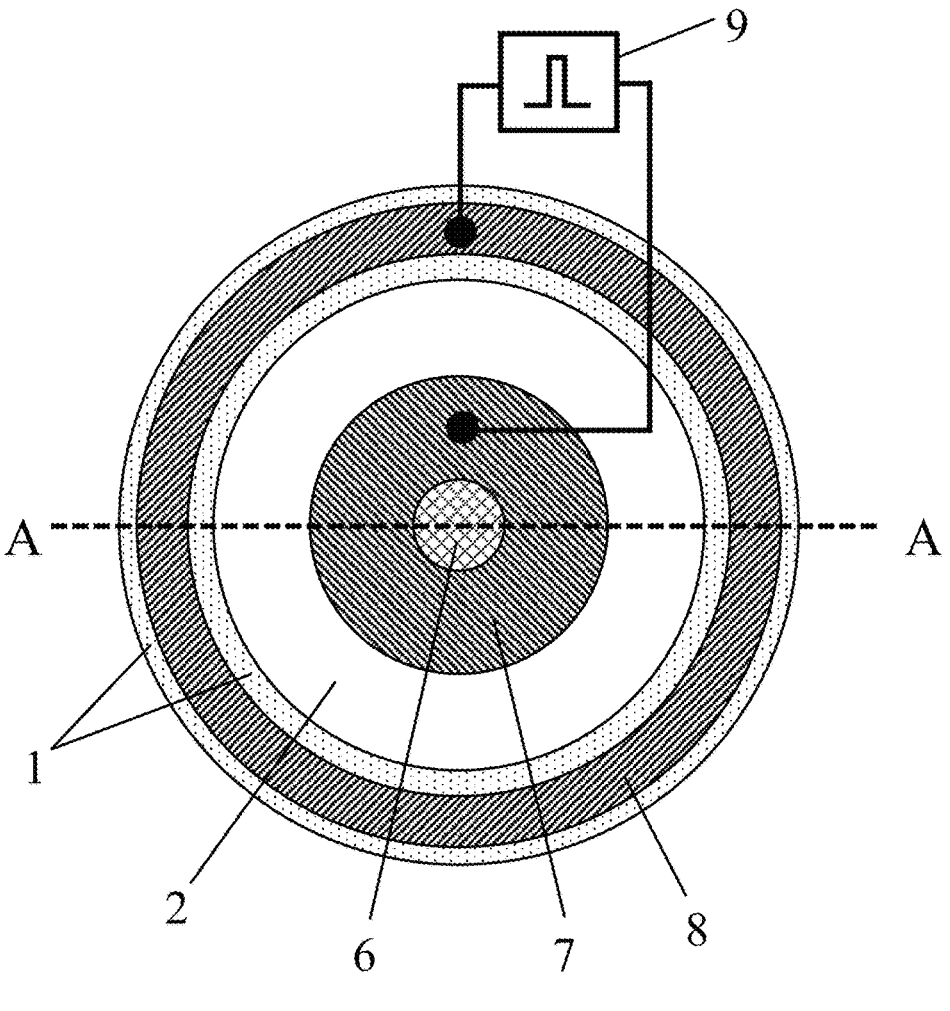
FIG. 3 is a schematic top view of a single-photon source structure according to Embodiment I of the present disclosure.

FIG. 3 is a schematic top view of a single-photon source structure according to Embodiment I of the present disclosure. Wherein, FIG. 2 is the schematic diagram of the side section cutting along the dotted line A-A in FIG. 3.

FIGS. 2 and 3 show a schematic diagram of the structure of a single-photon transmitter that can be used to achieve spin photons with controllable circular polarization.

As shown in FIG. 2, a pillar structure is formed above the semiconductor substrate 1. The pillar structure includes a bottom distributed Bragg reflector structure (DBR) 3 and a semiconductor pillar structure 4 above the bottom DBR 3.

A semiconductor single-quantum-dot structure (QD) 5 is grown in the semiconductor pillar structure 4.

The bottom distributed Bragg reflector 3 is located below the semiconductor pillar structure 4, and thus below the semiconductor single-quantum-dot structure QD 5, which is used to enhance the single-photon output efficiency in the upward direction.

Distributed Bragg reflector (DBR) is a periodic structure composed of two materials with different refractive index arranged alternately in the stack form of ABAB. The product of reflection index and the thickness of each layer of material is equal to ¼ of the central reflection wavelength.

For example, a layered distributed Bragg reflector, a first semiconductor layer, the semiconductor single-quantum-dot structure QD 5 and a second semiconductor layer can be successively grown on the semiconductor substrate 1.

After micro-lithography of all the epitaxial layers mentioned above, a micron-scale pillar structures (including DBR 3 and semiconductor pillar structure 4) can be formed. The cross section diameter of the pillar structure can be 2 to 3 microns, for example.

An insulating material layer 2, for example, may be formed around the pillar structure. The insulating material may be $SiO_2$ or BCB photoresist, for example. The insulating material layer 2 can protect the pillar structure (3, 4) by surrounding it, for example.

The top of the insulating material layer 2 can be processed to be flat with the upper surface of the semiconductor pillar structure 4.

A spin injection layer 6 may be further formed above the semiconductor pillar structure 4 to realize spin-polarized electron injection.

As shown in the top view of FIG. 3, the spin injection layer 6 may have the same disk shape as the pillar structure.

The diameter size of the spin injection layer 6 may be the same as or larger than that of the pillar structure (3, 4). As long as the carriers from the spin injection layer can be injected into the semiconductor quantum dot QD 5.

The layered distributed Bragg reflector 3, the first semiconductor layer, the semiconductor single-quantum-dot QD 5, the second semiconductor layer are formed above the semiconductor substrate 1. A spin injection layer is then grown on the top of the second semiconductor layer. And then, micro-lithography can be carried out on all the above grown layers to form a micron-pillar. The pillar structure can include spin injection layer 6, semiconductor pillar structure 4 and DBR 3 with generally the same cross section shape and diameter size.

Alternatively, the spin injection layer 6 can be formed above the insulating material layer 2 and the pillar structure (3, 4) after forming the pillar structure (3, 4) and the insulating material layer 2 as described above and making their top flat. The cross section shape of spin injection layer 6 can be different from that of semiconductor pillar structure 4. Generally, the spin injection layer 6 needs to cover at least the top of the semiconductor pillar structure 4.

In addition, an external mirror 11 (shown in FIG. 2 and not shown in FIG. 3) can be further provided above the whole structure, and above the spin injection layer, to form a vertical external cavity surface emitting laser (VECSEL) structure between the external mirror and the bottom distributed Bragg reflector 3. A micron-scale pillar resonant cavity is thus formed between the pillar of the DBR 3, the semiconductor pillar structure 4 and the spin injection layer 6 and the external mirror 11. Such a micron-scale pillar resonant cavity can greatly improve the single-photon emission efficiency of quantum dots.

Using an external mirror 11 to form a VECSEL structure can facilitate the integration of a ferromagnetic spin injection layer 6, for example, on the top of a semiconductor pillar structure 4 containing a semiconductor quantum dot QD 5.

A first electrode 7 can be then formed by depositing, for example, Ti/Au on portions on top of the ferromagnetic spin injection layer 6 and the insulating material layer 2 that are not covered by the ferromagnetic spin injection layer 6.

On the other hand, on the portions of the semiconductor substrate which are not covered by the insulating material layer 2, a second electrode 8 can be formed by depositing, for example, Ti/Au.

Thus, the first electrode 7 and the second electrode 8 are connected to the spin injection layer 6 and the semiconductor substrate 1, respectively. In addition, the first electrode 7 and the second electrode 8 can be connected to the two terminals of the pulsed voltage source 9 through an electric wire, to apply the pulsed voltage between the spin injection layer 6 and the semiconductor substrate 1, so as to inject a spin-polarized single-carrier from the spin injection layer 6 to the semiconductor single-quantum-dot structure QD 5.

As shown in the top view of FIG. 3 (the external reflector 11 is not shown), the first electrode 7 can be formed as a ring, and a central hole exposes the central part of the semiconductor pillar structure, so that the single-photon emitted by the semiconductor single-quantum-dot structure QD 5 can be emitted out from the central hole.

The insulating material layer 2 can also have a ring-pillar structure surrounding the pillar structure (3, 4) to protect the pillar structure (3, 4). The second electrode can also be formed as a ring around the insulating material layer 2.

It should be understood that the shapes of the above parts are not limited to circular and annular shapes. In particular, the only requirement of the first electrode 7 and the second electrode 8 is that they can be electrically connected to the spin injection layer 6 and the substrate 1 respectively. The first electrode 7 may be not surrounding the top of the pillar structure (3, 4). Similarly, the second electrode 2 may be not surrounding the periphery of the insulating material layer 2.

Next, the magnetic moment control scheme of the spin injection layer 6 will be described.

As mentioned above, according to the ways used to control the magnetic moment, spin injection layers with different shapes can be used.

The single-photon source structure of Embodiment I as shown in FIG. 2 to FIG. 3 can use an external magnetic field to control the magnetization direction of the spin injection layer. Accordingly, the spin injection layer can be disk-shaped.

It should be understood that in the case of controlling the magnetization direction of the spin injection layer 6 by using an external magnetic field, it will work as long as the spin injection layer 6 is located above the semiconductor single-quantum-dot structure QD 5 and completely covers the semiconductor pillar structure 4, and carriers can be injected into the semiconductor single-quantum-dot structure QD 5. In some lithography processes, a disk-shaped spin injection layer is easy to realize.

In this situation, the spin-injection material layer can be directly grown on the upper surface of the semiconductor material layer used to form the semiconductor pillar structure 4. And then the micron scale pillar structure can be processed by etching together the spin-injection layer 6 and the semiconductor pillar structure (3, 4).

In this way, the spin injection layer 6 can have the same size as the micron scale semiconductor pillar structure 4, the spin injection layer 6 and the pillar structure 4 are aligned up and down, that is, they are overlapped.

Moreover, the interface between the spin injection layer 6 and the semiconductor pillar structure 4 will remain very clean, which is beneficial to the injection of spin.

Refer to FIG. 2, external magnetic field application devices 12 and 12' can be arranged as a magnetic moment control device to apply pulsed magnetic field to the spin injection layer 6, so as to polarize or reverse the magnetization direction of the spin injection layer 6.

For example, the two external magnetic field application devices 12 and 12' can be arranged relatively, one is upper, the other is lower, and the aforementioned single-photon source device structure can be arranged between the two magnetic field application devices. The magnetic field can be applied to the spin injection layer 6 in a direction parallel to the axis of the semiconductor pillar structure 4 and perpendicular to the surface of the spin injection layer 6.

The upper external magnetic field application device 12 can be above or below the external mirror 11, and can be in a hollow form with a window in the middle, for example, so that the emitted single-photon can be transmitted through the window.

By switching the direction of the magnetic field (magnetic field line) with the external magnetic field application devices 12 and 12', an alternating reverse pulsed magnetic field can be applied to the spin injection layer 6 to reverse the magnetization direction of the spin injection layer 6.

After applying the pulsed magnetic field, or further, between two adjacent applications of pulsed magnetic field, a pulsed voltage can be applied between the first electrode 7 and the second electrode 8. As mentioned above, in response to the pulsed voltage, a spin-polarized single-carrier (e.g., an electron) is injected from the spin injection layer 6 to the semiconductor single-quantum-dot structure QD 5. The spin direction of the injected single-carrier depends on (is determined by) the polarized magnetization direction of the spin injection layer 6. Accordingly, the circular polarization direction of the emitted single-photon can also be controlled by the polarization of the magnetization direction.

FIG. 2 schematically shows the single-photon beam 10 of the emitted single-photon. By using the external magnetic field application devices 12 and 12' to apply the external pulsed magnetic field, the circular polarization direction of the emitted single-photon beam 10 can be switched between "σ+" And "σ−".

Hereinafter, the working time sequence of the single-photon source of Embodiment I applying pulsed magnetic field (H) and vertical pulsed voltage (V) will be described with reference to FIG. 4.

Figure 4:
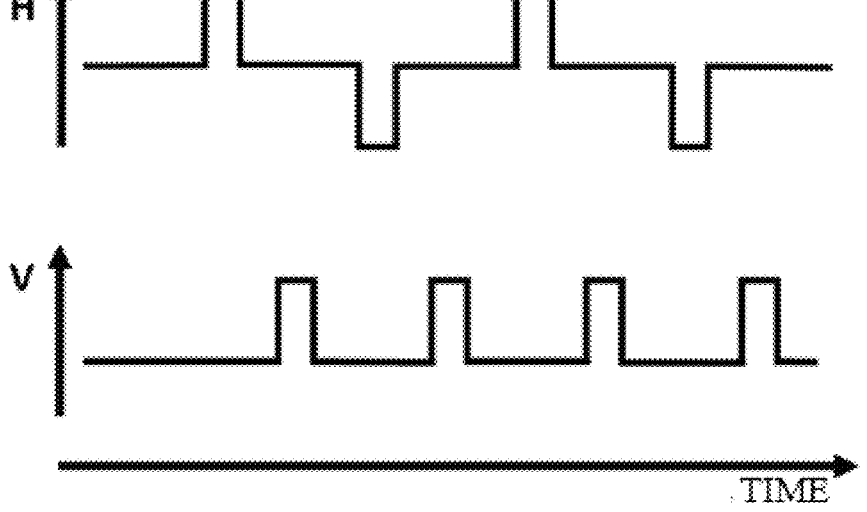
FIG. 4 is a working time sequence diagram of a single-photon source according to Embodiment I of the present disclosure.

FIG. 4 is a working time sequence diagram of a single-photon source according to Embodiment I of the present disclosure.

In FIG. 4, the upper pulse curve is the schematic time sequence diagram of the external pulsed magnetic field (H) applied by the external magnetic field application devices 12 and 12'. The lower pulse curve is a schematic timing diagram of the pulsed voltage (V) applied between the first electrode 7 and the second electrode 8.

First, the external magnetic field application devices 12 and 12' apply external pulsed magnetic field (the upward magnetic field pulse H in FIG. 4) to polarize the magnetization direction of the spin injection layer 6. Here, the magnetization direction after this polarization can be called as "the first direction".

Then, pulsed voltage is applied between the spin injection layer 6 and the substrate 1 through the first electrode 7 and the second electrode 8, respectively. Under the action of the applied pulsed voltage, a single-carrier is injected from the spin injection layer 6 into the semiconductor single-quantum-dot structure QD 5. The spin direction of the single-carrier depends on (is determined by) the polarized magnetization direction of the spin injection layer 6.

In response to the injected single-carrier, the semiconductor single-quantum-dot structure QD 5 emits a single-photon with a certain degree of circular polarization, whose circular polarization direction corresponds to the spin direction of the injected single-carrier, and accordingly depends on the polarized magnetization direction of the spin injection layer 6.

According to the optical selection rule, if 100% spin-polarized electron injection can be achieved, it can be expected to obtain nearly 100% circularly polarized single-photon with a certain direction of circular polarization.

Then, in the next cycle, the external magnetic field application devices 12 and 12' apply external pulsed magnetic field (the downward magnetic field pulse in FIG. 4) to reverse (or switch, or flip) the magnetization direction of the spin injection layer 6, making it opposite to the magnetization direction in the previous cycle. Here, the magnetization direction after this reversal can be called as "the second direction".

Thus, after applying pulsed voltage between the spin injection layer 6 and the substrate 1 through the first electrode 7 and the second electrode 8, respectively, the spin direction of the carrier injected from the spin injection layer 6 into the semiconductor single-quantum-dot structure QD 5 is opposite to the spin direction of the single-carrier injected in the previous cycle. Accordingly, the circular polarization direction of the single-photon emitted by the semiconductor single-quantum-dot structure QD 5 is also opposite to that of the single-photon emitted in the previous cycle.

By repeating such cycles, the magnetization direction of the spin injection layer 6 can be switched between the first direction and the second direction by applying the alternating reverse external pulsed magnetic field. And the circular polarization direction of the single-photon emitted in adjacent cycles can be switched successively by applying pulsed voltage between adjacent application of alternating reverse external pulsed magnetic fields.

Embodiment II

In Embodiment II, the spin injection layer may be of a shape of a Hall bar. The magnetization direction of the spin injection layer can be controlled in electrical control mode.

First, with reference to FIG. 5, the spin Hall effect in the Hall bar channel is described below [Ref. 12].

FIG. 5 is a schematic diagram of magnetic moment reversal by means of spin Hall effect in the spin injection layer with Hall-bar-shaped channel.

In order to control the circular polarization direction of the emitted single-photon, the spin injection layer can be made as a Hall bar shape. And the magnetization direction of the spin injection layer can be reversed by the spin Hall effect. And thus, the spin direction of the injected electrons can be modulated to control the circular polarization direction of the emitted single-photon.

As shown in FIG. 5, current I is injected into the specially designed spin injection layer channel composed of heavy metal/ferromagnetic metal (HM/FM) multilayer films, so as to generate current-induced spin orbit field ($H_{SO}$) and spin orbit torque ($\tau_{SO}$).

Meantime, with the help of a small external in-plane constant magnetic field ($H_{ext}$), the perpendicular magnetization direction of the spin injection layer can be switched. Recent progress in the field of spintronics shows that the usage of external constant magnetic field ($H_{ext}$) can be avoided by using different strategies, such as the ferromagnetic layer with mixed magnetic structure [Ref. 13], the ferromagnetic alloy film with non-uniformed composition distribution [Ref. 14], the substrate with specific crystal orientation [Ref. 15], and so on.

In order to electrically control the magnetization of the spin injection layer by spin Hall effect, an ultra-thin spin injection layer containing heavy metal/ferromagnetic metal can be used to process into a Hall-bar-shaped channel.

In this situation, a semiconductor micron-pillar (bottom DBR 3, semiconductor pillar structure 4) can be processed firstly and filled with insulating materials such as $SiO_2$ or BCB photoresist around it. After the surface is processed to become completely flat, the spin injection layer 6' is deposited and photo-lithographed. There might be some residual glue or damage left by the micron-pillar lithography process at the interface between the spin injection layer 6' and the semiconductor. Therefore, the semiconductor surface should be properly chemically cleaned before the growth of the spin injection layer 6'.

FIG. 6 is a schematic side sectional view of a single-photon source structure according to Embodiment II of the present disclosure.

FIG. 7 is a schematic top view of a single-photon source structure according to Embodiment II of the present disclosure. Wherein, FIG. 6 is the schematic diagram of the side section cutting along the dotted line B-B in FIG. 7. The external minor 11 is not shown in FIG. 7.

Compared with the single-photon source of Embodiment I, the single-photon source of Embodiment II uses a Hall bar channel for the spin injection layer 6'.

As an example, as shown in FIG. 7, four electrodes are arranged above the insulating material layer 2, first electrodes 7' and 7", a third electrode 13 and a fourth electrode 14, which are respectively connected to the spin injection layer 6' in a structure of Hall bar channel.

The semiconductor substrate 1, insulating material layer 2, bottom DBR 3, semiconductor pillar structure 4, and second electrode 8 can be the same as the corresponding components in Embodiment I, which will not be further described here to avoid repetition.

The main body of the Hall bar channel can be rectangular. The middle part of channel can be extended along the transverse direction to be connected with electrodes. The first electrode 7' and/or 7" formed above the insulating material layer 2 is connected to the extension part in the middle of the Hall bar to apply a pulsed voltage between the Hall bar channel (spin injection layer 6') and the substrate (connected to the second electrode 8), provided by a pulsed voltage source 9.

On the other hand, the magnetization direction of the Hall bar channel can be polarized by applying a pulsed current along the channel direction, for example.

In Embodiment II, the magnetic moment control device may include the third electrode 13 and the fourth electrode 14. The third electrode 13 and the fourth electrode 14 are connected to a pulse current source 15 through an electric wire. Moreover, the third electrode 13 and the fourth electrode 14 are respectively connected to two opposite ends of the Hall bar channel 6' along the lengthwise direction for example, to apply pulsed current provided by the pulse current source 15 in the Hall bar channel, so as to polarize or reverse the magnetization direction of the Hall bar channel (spin injection layer 6').

For example, the magnetization direction of the Hall bar channel 6' can be reversed by applying a reverse pulsed current in the Hall bar channel 6', so as to switch the spin direction of carrier such as electron injected into the semiconductor in response to the applied pulsed voltage between the Hall bar channel and the substrate 1, and thus to switch the circular polarization direction of the single-photon emitted by the semiconductor single-quantum-dot QD 5.

The first electrode 7' and/or 7" and the second electrode 8 are connected to the spin injection layer 6' and the semiconductor substrate 1, respectively. In addition, the first electrode 7' and/or 7" and the second electrode 8 can be connected to the two terminals of the pulsed voltage source 9 through an electric wire, for example, to apply the pulsed voltage between the spin injection layer 6' and the semiconductor substrate 1 to inject a spin-polarized single-carrier from the spin injection layer 6' into the semiconductor single-quantum-dot structure QD 5.

In Embodiment II, a transverse pulsed current is applied in the Hall bar channel of the spin injection layer 6' for magnetization switching. And then, a vertical pulsed voltage is applied between the spin injection layer 6' and the semiconductor substrate 1 to emit circularly polarized single-photon.

The first electrode 7' and 7", the third electrode 13 and the fourth electrode 14 formed above the insulating material layer 2 are further described as follows.

In some embodiments, the first electrode 7' and/or 7" can be used to apply the aforementioned pulsed voltage with respect to the second electrode 8, while the third electrode 13 and the fourth electrode 14 can be used to apply the aforementioned pulsed current.

In other embodiments, as shown in FIG. 8, it is also possible to directly use the third electrode 13 and/or the fourth electrode 14 as the first electrode without arranging the electrode 7' and/or 7". That is to say, the aforementioned pulsed voltage can be applied between the third electrode 13 and/or the fourth electrode 14 and the second electrode 8, and then the aforementioned pulsed current can be applied between the third electrode 13 and the fourth electrode 14.

FIG. 8 is a schematic top view of a single-photon source structure with only two electrodes connected to the spin injection layer according to Embodiment II of the present disclosure.

In other words, all of the four electrodes 7', 7", 13 and 14 on the Hall bar shown in FIG. 7 can be used as the first electrode to apply a pulsed voltage with respect to the second electrode 8, and thus injecting spin-polarized carriers into the semiconductor single-quantum-dot.

In fact, the first electrode only needs to be arranged to be electrically connected with the spin injection layer 6'.

Hereinafter, the working time sequence of applying transverse pulsed current (I) and vertical pulsed voltage (V) to the single-photon source of Embodiment II is described with reference to FIG. 9.

FIG. 9 is a working time sequence diagram of a single-photon source according to Embodiment II of the present disclosure.

In FIG. 9, the upper pulse curve is the schematic timing diagram of the transverse pulsed current (I) applied by the pulse current source 15. The lower pulse curve is a schematic timing diagram of pulsed voltage (V) applied between the first electrode 7' and the second electrode 8.

First, the pulse current source 15 provides a transverse pulsed current (I) (the upward current pulse in FIG. 9) along the lengthwise direction of the spin injection layer 6' through the third and fourth electrodes, so as to polarize the magnetization direction of the spin injection layer 6'. Here, the magnetization direction after this polarization can be called as "the first direction".

Then, a bias pulsed voltage is applied between the spin injection layer 6' and the substrate 1 through the first electrode 7' and the second electrode 8 to realize the single-photon emission with the corresponding circular polarization direction. Under the action of the applied pulsed voltage, a single-carrier is injected from the spin injection layer 6' into the semiconductor single-quantum-dot structure QD 5. The spin direction of the single-carrier depends on (is determined by) the magnetization direction of the polarization of the spin injection layer 6'.

In response to the injected single-carrier, the semiconductor single-quantum-dot structure QD 5 emits a single-photon with a certain degree of circular polarization, whose circular polarization direction corresponds to the spin direction of the injected single-carrier, and accordingly depends on the magnetization direction of the polarization of the spin injection layer 6'.

According to the optical selection rule, if 100% spin-polarized electron injection can be achieved, it can be expected to obtain nearly 100% circularly polarized single-photon with a certain direction of circular polarization.

Then, in the next cycle, the pulse current source 15 provides a transverse reverse pulsed current (I) (the downward current pulse in FIG. 9) along the lengthwise direction of the spin injection layer 6' through the third electrode and the fourth electrode, so as to reverse the magnetization direction of the spin injection layer 6', making it opposite to the polarized magnetization direction in the previous cycle. Here, the magnetization direction after this reversal can be called as "the second direction". The magnetic moment can be stabilized in different states by changing current direction.

Thus, after applying pulsed voltage between the spin injection layer 6' and the substrate 1 through the first electrode 7' and the second electrode 8, the spin direction of the carrier injected from the spin injection layer 6' into the semiconductor single-quantum-dot structure QD 5 is opposite to the spin direction of the single-carrier emitted in the previous cycle. Accordingly, the circular polarization direction of the single-photon emitted by the semiconductor single-quantum-dot structure QD 5 is also opposite to that of the single-photon emitted in the previous period.

By repeating such cycles, the magnetization direction of the spin injection layer 6' can be switched between the first direction and the second direction by applying the alternating reverse transverse pulsed current. And, the circular polarization direction of the single-photon emitted in adjacent cycles can be switched successively by applying pulsed voltage between adjacent application of alternating reverse pulsed current.

Through spin hall effect, the magnetic moment reversal can be achieved within 0.2 ns [Ref. 16]. Therefore, the spin-polarized single-photon transmitter (single-photon source) of Embodiment II in the present disclosure will allow to modulate and transmit a single-photon with 100% change of circular polarization direction at a speed up to GHz. And the modulation speed is much higher than the magnetic field modulation in Embodiment I.

Variant Schemes

In order to further improve the device performance, some further amendments or improvements can be made on the basis of Embodiment I and Embodiment II.

Here, variant schemes will be described respectively in three aspects: spin filter layer, top DBR and optical window (aperture).

It should be understood that these variant schemes can be applied, separately or in any combination, in the embodiments of the present disclosure.

Variant 1: Spin Filtering Layer

FIG. 10A is a schematic diagram of incorporating a spin filtering layer to the single-photon source structure in Embodiment I of the present disclosure. FIG. 10B is a schematic diagram of incorporating a spin filtering layer to the single-photon source structure in Embodiment II of the present disclosure.

The spin filter layer 17 can be arranged between the spin injection layers 6, 6' and the semiconductor single-quantum-dot structure QD 5.

FIG. 11A is a schematic diagram of incorporating a spin filtering layer under the semiconductor single-quantum-dot structure to the single-photon source structure in Embodiment I of the present disclosure. FIG. 11B is a schematic diagram of incorporating a spin filtering layer under the semiconductor single-quantum-dot structure to the single-photon source structure in Embodiment II of the present disclosure.

The spin filter layer 17 can also be arranged between the semiconductor single-quantum-dot structure QD 5 and the first semiconductor layer.

The spin filter layer 17 can be formed as a part of the pillar structure.

On the basis of Embodiment I, the bottom DBR 3, semiconductor pillar structure 4, spin filter layer 17, and spin injection layer 6 can be etched together to form a pillar structure.

On the basis of Embodiment II, the bottom DBR 3, semiconductor pillar structure 4, and spin filter layer 17 can be etched together to form a pillar structure.

The spin filter layer 17 incorporated between the spin injection layer 6, 6' and the semiconductor pillar structure 4, carries out spin selective recombination with the spin-polarized carriers passing through, thus playing a role of spin filtering and enhancing spin polarization.

The spin filter layer 17 can be also incorporated between the semiconductor single-quantum-dot structure QD 5 and the first semiconductor layer. It will reflect the spin polarized carrier into the single-quantum-dot and carries out spin selective recombination, thus playing a role of spin filtering and enhancing spin polarization.

Recent research on semiconductor spintronics found that, a defect layer incorporated near the semiconductor active region can generate spin direction selective recombination with the spin-polarized electrons passing through, thus playing a role of spin filtering. After passing through or reflecting by the spin filter layer, the spin polarization of the electrons arriving at the active region will be greatly increased, thus achieving a very high circular polarization of light emission (90%) [Ref. 17]. In addition, because the spin filtering effect of the defect layer increases with the increase of temperature, it is very beneficial to realize a single-photon device emitting single-photon with a controllable circular polarization direction at room temperature.

In the design of the single-photon source device in the present disclosure, the spin filter layer can be inserted into the semiconductor structure to enhance the circular polarization efficiency.

Variant 2: Top DBR

In Embodiment I and Embodiment II described above, an external mirror 11 can be arranged above the device to form an external resonant surface emitting laser structure between the external mirror 11 and the bottom distributed Bragg reflector (DBR) 3.

In the scheme of variant 2, a top distributed Bragg reflector (DBR) 16, 16' (such as the dielectric Bragg reflector structure formed by alternative deposition of different materials such as $CaF_2/ZnS$, $MgF_2/ZnS$) can be formed inside the device, and above the spin injection layer 6 and 6'. A intracavity resonance surface emitting laser structure between the top distributed Bragg reflector (DBR) 16, 16' and the bottom distributed Bragg reflector 3. It is no longer necessary to arrange an external reflector 11.

FIG. 12A is a schematic diagram showing that an intracavity resonant surface emitting laser is formed by incorporating a top DBR to the single-photon source structure in Embodiment I of the present disclosure. FIG. 12B is a schematic diagram showing that an intracavity resonant surface emitting laser is formed by incorporating a top DBR to the single-photon source structure in Embodiment II of the present disclosure.

By replacing the external mirror 11 with a top DBR, the device can be made smaller.

Variant 3: Optical Aperture

In the scheme of variant 3, apertures 18 and 18' can be arranged in the spin injection layers 6 and 6', respectively. The apertures 18, 18' can be located directly above the single-quantum-dot in the semiconductor single-quantum-dot structure 5. The arrangement of the aperture can reduce the absorption of single-photon by the spin injection layer, thus improving the single-photon emission efficiency.

FIG. 13A is a schematic diagram of arranging an optical aperture in the single-photon source structure of Embodiment I of the present disclosure to improve the emission efficiency of single-photons.

FIG. 13B is a schematic diagram of arranging an optical aperture in the single-photon source structure of Embodiment II of the present disclosure to improve the emission efficiency of single-photons.

Because the metal spin injection layer 6 and 6' has a certain thickness, such as 2-6 nm, they will have certain absorption to single-photon at a ratio of such as about 3%-10%. In order to improve the emission efficiency of single-photon, an aperture 18, 18' with a diameter of 50-100 nm can be opened in the spin injection layer 6, 6' directly above the semiconductor single-quantum-dot structure QD 5 to improve the single-photon transmission efficiency.

Since the distance between the spin injection layers 6 and 6' and the semiconductor single-quantum-dot structure QD 5 is about 80 nm, and the spin relaxation length in the semiconductor is more than 100 nm, the opening of this aperture will not have a significant impact on the spin injection efficiency of the spin injection layers 6 and 6'.

In this way, the emission efficiency of single-photon can be improved by arranging apertures 18 and 18' in the spin injection layers 6 and 6'.

So far, with reference to FIG. 1 to FIG. 13B, embodiments of a single-photon source (single-photon transmitter) based on spin injection according to the present disclosure is described in detail.

Advantages

Single-photon transmitter based on spin injection according to the embodiments of the present disclosure may have the following unique advantages.

First of all, since the ground state of the conduction band of a single-quantum-dot can only receive a pair of electrons with opposite spin directions at a time, and the spin-polarized electron injection method is used to inject only one electron with one spin direction, so only one spin-polarized electron can be injected into the single-quantum-dot at a time, so that a single-photon can be emitted deterministically, avoiding the single-photon emission delay problem caused by double-exciton cascade recombination.

Secondly, at present, the spin polarization efficiency of ferromagnetic injection layer can be very high, for example, semi-metal can achieve a spin injection efficiency of nearly 100%. And with a GaNAs spin filter layer, the spin selective recombination mechanism by the defects in GaNAs can effectively increase the spin injection efficiency [Ref. 17]. Therefore, a spin-polarized single-photon source can emit a single-photon with a determined circular polarization direction.

Thirdly, in Embodiment II, the circular polarization direction of the single-photon can be modulated at high speed through the electrical control of the magnetization of the ferromagnetic injection layer, and the information can be encoded and transmitted. Compared with traditional optical device for modulating polarization, not only the speed can reach GHz, but also the device can be miniaturized.

Single-photon source with controllable circular polarization will show its unique advantages in quantum optical communication and computation applications. For the application of quantum optical communication, since the single-photon with certain (determined) circular polarization can be emitted each time, it is no longer necessary to use a polarizer to filter the single-photons with random polarization directions, which can improve the efficiency of quantum optical communication by at least 50%. For the quantum optical computation, its role will be more important.

In addition, in the currently existing single-quantum-dot, since a pair of electrons with opposite spin directions may be injected together into the ground state of the conduction band at the same time, there is a certain probability for the existing single-quantum-dot that the emitted single-photons are resulted from the cascade recombination of double-exciton and single-exciton. Thus, the resulting single-photons will have a time delay compared to the generation of single-photon without cascade recombination, thus affecting the indistinguishability of single-photons.

According to the single-photon source device of the present disclosure, the spin injection layer can only inject carriers with a certain spin direction into a single-quantum-dot. Therefore, the above-mentioned problem affecting the single-photon indistinguishability caused by the cascade recombination of double-exciton and single-exciton can be avoided.

Single-Photon Source Cluster

When multiple single-photon sources according to the present disclosure form a single-photon source cluster, multiple single-photon sources can simultaneously emit multiple single-photons with the same (identical) circular polarization direction. Each single-photon can be used as a quantum bit for quantum computation or quantum communication.

FIG. 14 is a schematic top view of a single-photon source cluster according to the present disclosure.

As shown in FIG. 14, the single-photon source cluster 100 according to the present disclosure may include multiple single-photon sources 110. The single-photon source 110 may be the single-photon source as described above.

The multiple single-photon sources 110 can share the semiconductor substrate 1.

The magnetization directions of the spin injection layers 6 and 6' of the multiple single-photon sources 110 can be synchronously polarized to the same direction. In addition, the same pulsed voltage is synchronously applied between the spin injection layers 6 and 6' of the multiple single-photon sources and the semiconductor substrate 1. Single-carriers are thus injected into the semiconductor single-quantum-dot structures QD 5 from the spin injection layers 6 and 6' at the same time. And then, single-photons with the same (identical) circular polarization direction are emitted simultaneously from the single-quantum-dots in the semiconductor single-quantum-dot structures QD 5 of the multiple single-photon sources.

FIG. 15A and FIG. 15B are schematic diagrams for comparing the probability of simultaneously collecting N single-photons with the same circular polarization from an ordinary single-photon source and a single-photon source according to the present disclosure.

The polarization direction of the photons emitted by the ordinary single-photon source is random. It is necessary to use a polarizer with the same polarization direction to make the respective photons have the same polarization direction.

As shown in FIG. 15A, assuming that N single-photon bits are used for quantum computation, each ordinary single-photon transmitter $E_1$, $E_2$, . . . , $E_N$ has only a 50% probability of passing through the polarizer 19, so the probability of collecting N identical single-photons at the same time is $P(N)=\frac{1}{2}^N$.

However, according to the present disclosure, all photons simultaneously emitted by multiple spin-polarized single-photon sources $S_1$, $S_2$, . . . , $S_N$ in the single-photon source cluster have the same circular polarization, and completely consistent linear polarization direction can be obtained by passing through a ¼ wave plate 20, so the probability of simultaneously collecting N identical single-photons is $P(N)=1$.

Therefore, the probability of collecting N indistinguishable single-photons is 2' times higher than that of ordinary single-photon transmitters, which will be of unprecedented advantages for quantum optical computation applications.

Embodiments of the present disclosure have been described above. The above description is exemplary, not exhaustive, and not limited to the disclosed embodiments. Without deviating from the scope and spirit of the described embodiments, many modifications and changes are obvious to ordinary technicians in the art. The selection of terms used herein is intended to best explain the principle, practical application or improvement of technology in the market of respective embodiments, or to enable ordinary technicians in the art to understand the respective embodiments disclosed herein.

REFERENCES

[1] B. Lounis and M. Orrit, Single-photon sources, Rep. Prog. Phys. 68, 1129 (2005).

[2] S. Buckley, K. Rivoire, and J. Vučković, Engineered quantum dot single-photon sources, Rep. Prog. Phys. 75, 126503 (2012).

[3] P. Kok, W. J. Munro, K. Nemoto, T. C. Ralph, J. P. Dowling, and G. J. Milburn, Linear optical quantum computing with photonic qubits, Rev. Mod. Phys. 79, 135 (2007).

[4] J. L. O'Brien, A. Furusawa, and J. Vučković, Photonic quantum technologies, Nat. Photonics 3, 687 (2009).

[5] J.-W. Pan, Z.-B. Chen, C.-Y. Lu, H. Weinfurter, A. Zeilinger, and M. Żukowski, Multiphoton entanglement and interferometry, Rev. Mod. Phys. 84, 777 (2012).

[6] S. Aaronson and A. Arkhipov, Proceedings of the 43rd Annual ACM Symposium on Theory of Computing, 2011, San Jose (ACM, New York, 2011), p. 333.

[7] H.-S. Zhong, H. Wang, Y-H. Deng, M.-C. Chen, L. C. Peng, Y.-H. Luo, J. Qin, D. Wu, X. Ding, Y. Hu, P. Hu, X.-Y. Yang, W.-J. Zhang, H. Li, Y. Li, X. Jiang, L. Gan, G. Yang, L. You, Z. Wang, L. Li, N.-L. Liu, C.-Y. Lu, and J.-W. Pan, Quantum computational advantage using photons, Science 370, 1460 (2020).

[8] Xing Ding, Yu He, Z.-C. Duan, Niels Gregersen, M.-C. Chen, S. Unsleber, S. Maier, Christian Schneider, Martin Kamp, Sven Hofling, Chao-Yang Lu, and Jian-Wei Pan, On-Demand Single-photons with High Extraction Efficiency and Near-Unity Indistinguishability from a Resonantly Driven Quantum Dot in a Micropillar, Phys. Rev. Lett. 116, 020401 (2016).

[9] Ravitej Uppu, Freja T. Pedersen, Ying Wang, Cecilie T. Olesen, Camille Papon, Xiaoyan Zhou, Leonardo Midolo, Sven Scholz, Andreas D. Wieck, Arne Ludwig, Peter Lodahl, Scalable integrated single-photon source, Sci. Adv. 6: eabc8268 (2020).

[10] Dyakonov, M. I.; Perel, V. L., Optical orientation/F. Meier, B. P. Zakharchenya. Amsterdam 1984, 8, 22-24.

[11] R. Fiederling, M. Keim, G. Reuscher, W. Ossau, G. Schmidt, A. Waag, L. W. Molenkamp, Injection and detection of a spin-polarized current in a light-emitting diode, Nature 402, 787 (1999).

[12] L. Liu, C.-F. Pai, Y. Li, H. W. Tseng, D. C. Ralph, R. A. Buhrman, Spin-torque switching with the giant spin Hall effect of tantalum, Science 336, 555 (2012).

[13] Hongwei Li, Gaili Wang, Dan Li, Ping Hu, Wenqi Zhou, Shuai Dang, Xingyuan Ma, Tian Dai, Songdan Kang, Fengmei Yu, Xiang Zhou, Shuxiang Wu, and Shuwei Li, Field-Free Deterministic Magnetization Switching with Ultralow Current Density in Epitaxial Au/Fe4N Bilayer Films, ACS Appl. Mater. Interfaces 11, 16965 (2019).

[14] Liang Liu, Jihang Yu, Rafael Gonzalez-Hernandez, Changjian Li, Jinyu Deng, Weinan Lin, Chenghang Zhou, Tiejun Zhou, Jing Zhou, Han Wang, Rui Guo, Herng Yau Yoong, Gan Moog Chow, Xiufeng Han, Bertrand Dupe, Jakub Železný, Jairo Sinova, and Jingsheng Chen, Electrical switching of perpendicular magnetization in a single ferromagnetic layer, Phys. Rev. B 101, 220402(R) (2020).

[15] Liang Liu, Chenghang Zhou, Xinyu Shu, Changjian Li, Tieyang Zhao, Weinan Lin, Jinyu Deng, Qidong Xie, Shaohai Chen, Jing Zhou, Rui Guo, Han Wang, Jihang Yu, Shu Shi, Ping Yang, Stephen Pennycook, Aurelien Manchon, and Jingsheng Chen, Symmetry-dependent field-free switching of perpendicular magnetization, Nature Nanotechnology, 16, 277 (2021).

[16] K. Garello et al., "SOT-MRAM 300MM Integration for Low Power and Ultrafast Embedded Memories," 2018 IEEE Symposium on VLSI Circuits, 2018, pp. 81-82, doi: 10.1109/VLSIC.2018.8502269.

[17] Yuqing Huang, Ville Polojarvi, Satoshi Hiura, Pontus Hojer, Arto Aho, Riku Isoaho, Teemu Hakkarainen, Mircea Guina, Shino Sato, Junichi Takayama, Akihiro Murayama, Irina A. Buyanova 1 and Weimin M. Chen, Room-temperature electron spin polarization exceeding 90% in an opto-spintronic semiconductor nanostructure via remote spin filtering, Nature Photonics 15, 475 (2021).

What is claimed is:

1. A single-photon source emitting light with a controllable circular polarization direction comprising:

a semiconductor substrate;

a pillar structure located above the semiconductor substrate and comprising a semiconductor single-quantum-dot structure;

a spin injection layer located above the pillar structure and configured to inject a spin-polarized carrier into the semiconductor single-quantum-dot structure;

a first electrode and a second electrode respectively connected to the spin injection layer and the semiconductor substrate and configured to apply a pulsed voltage between the spin injection layer and the semiconductor substrate, so as to inject a spin-polarized single-carrier into the semiconductor single-quantum-dot structure from the spin injection layer, wherein in response to the injected spin-polarized single-carrier, a single-photon is emitted from the single-quantum-dot in the semiconductor single-quantum-dot structure with the circular polarization direction determined by the spin direction of the spin-polarized single-carrier.

2. The single-photon source of claim 1 further comprising:

a magnetic moment controller configured to polarize a magnetization direction of the spin injection layer, after the magnetization direction of the spin injection layer is polarized, the pulsed voltage is applied between the spin injection layer and the semiconductor substrate via the first electrode and the second electrode, the spin-polarized single-carrier will be injected into the semiconductor single-quantum-dot structure from the spin injection layer, the spin direction of the spin-polarized single-carrier depends on the polarized magnetization direction of the spin injection layer.

3. The single-photon source of claim 2, wherein the magnetic moment controller comprises an external magnetic field application device for applying pulsed magnetic field to the spin injection layer to polarize the magnetization direction of the spin injection layer.

4. The single-photon source of claim 3, wherein the external magnetic field application device is controlled to apply alternating reverse pulsed magnetic field to the spin injection layer, so as to alternatively switch the magnetization direction of the spin injection layer.

5. The single-photon source of claim 3, wherein the pulsed voltage is applied in the interval between adjacent applications of pulsed magnetic field to emit single-photon.

6. The single-photon source of claim 2, wherein the spin injection layer has a Hall bar channel, the magnetic moment controller comprises a third electrode and a fourth electrode respectively connected to two opposite ends of the Hall bar channel to apply a pulsed current into the Hall bar channel, so as to polarize the magnetization direction of the spin injection layer.

7. The single-photon source of claim 6, wherein alternating reverse pulsed current is applied into the Hall bar channel to alternatively reverse the magnetization direction of the spin injection layer.

8. The single-photon source of claim 6, wherein the pulsed voltage is applied in the interval between adjacent applications of pulsed current to emit single-photon.

9. The single-photon source of claim 1 further comprising:

a spin filtering layer located between the spin injection layer and the semiconductor single-quantum-dot structure or under the semiconductor single-quantum-dot structure, playing a role to filter spin by spin selective recombination of the spin-polarized carrier passing through.

10. The single-photon source of claim 1, wherein the pillar structure further comprising:

a bottom distributed Bragg reflector located below the semiconductor single-quantum-dot structure to enhance output efficiency of single-photon in an upward direction.

11. The single-photon source of claim 10 further comprising:

a top distributed Bragg reflector above the spin injection layer, an intracavity resonant surface emitting laser structure is formed between the top distributed Bragg reflector and the bottom distributed Bragg reflector.

12. The single-photon source of claim 10 further comprising:

an external mirror above the spin injection layer, an external resonant surface emitting laser structure is formed between the external mirror and the bottom distributed Bragg reflector.

13. The single-photon source of claim 1, wherein, the spin injection layer comprises an aperture directly above the single-quantum-dot in the semiconductor single-quantum-dot structure.

14. A single-photon source cluster comprising:

a plurality of single-photon sources of claim 1, the plurality of single-photon sources share the same semiconductor substrate, wherein the magnetization directions of the spin injection layers of the plurality of single-photon sources are polarized to the same direction, a single pulsed voltage is simultaneously applied between the spin injection layer of each single-photon source and the semiconductor substrate, spin-polarized single-carriers are respectively injected into each of the semiconductor single-quantum-dot structures from the spin injection layers simultaneously, and single-photons with identical circular polarization direction are respectively emitted by the single-quantum-dots in the semiconductor single-quantum-dot structures of the plurality of single-photon sources simultaneously.

* * * * *